(12) United States Patent
Li

(10) Patent No.: US 10,340,385 B2
(45) Date of Patent: Jul. 2, 2019

(54) METHOD TO IMPROVE FINFET DEVICE PERFORMANCE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/688,524

(22) Filed: Aug. 28, 2017

(65) Prior Publication Data
US 2018/0122948 A1 May 3, 2018

(30) Foreign Application Priority Data
Oct. 31, 2016 (CN) .......................... 2016 1 0927351

(51) Int. Cl.
H01L 29/78 (2006.01)
H01L 29/66 (2006.01)
(Continued)

(52) U.S. Cl.
CPC ........ H01L 29/7854 (2013.01); H01L 21/268 (2013.01); H01L 21/823814 (2013.01);
(Continued)

(58) Field of Classification Search
CPC .......... H01L 29/7854; H01L 29/66795; H01L 29/66803; H01L 29/78621;
(Continued)

(56) References Cited

U.S. PATENT DOCUMENTS 9,105,742 B1 8/2015 Basker et al.
9,711,619 B1 * 7/2017 Peng .................... H01L 21/2253
(Continued)

OTHER PUBLICATIONS

European Application No. EP17198884.3, Extended European Search Report dated Mar. 2, 2018, 10 pages.

*Primary Examiner* — Shahed Ahmed
(74) *Attorney, Agent, or Firm* — Kilpatrick Townsend & Stockton LLP

(57) ABSTRACT

A method for manufacturing a semiconductor device includes providing a substrate structure having PMOS and NMOS regions. The PMOS region includes a first region, a first gate structure on the first region, and first source and drain regions on opposite sides of the first gate structure. The NMOS region includes a second region and a second gate structure on the second region. The method also includes introducing a p-type dopant into the first source and drain regions, performing a first annealing, forming second source and drain regions on opposite sides of the second gate structure, introducing an n-type dopant into the second source and drain regions, and performing a second annealing. The method satisfies thermal budget requirements of forming PMOS and NMOS devices, thereby enabling a better diffusion of the p-type dopant into the source and drain regions of the PMOS device without affecting the performance of the NMOS device.

13 Claims, 6 Drawing Sheets

(51) Int. Cl.
*H01L 29/786* (2006.01)
*H01L 21/8238* (2006.01)
*H01L 21/268* (2006.01)

(52) U.S. Cl.
CPC .. *H01L 29/66795* (2013.01); *H01L 29/66803* (2013.01); *H01L 29/78621* (2013.01); *H01L 21/823821* (2013.01)

(58) Field of Classification Search
CPC ..... H01L 21/823418; H01L 21/823814; H01L 27/1122; H01L 29/0653; H01L 29/0843; H01L 21/02694; H01L 21/324; H01L 21/477
USPC ......... 257/288, 368, 369; 438/151, 197, 199
See application file for complete search history.

(56) References Cited

U.S. PATENT DOCUMENTS

| | | | |
|---|---|---|---|
| 2003/0201455 A1* | 10/2003 | Takahashi | H01L 29/0692 257/136 |
| 2008/0145987 A1 | 6/2008 | Shima | |
| 2011/0127617 A1 | 6/2011 | Scheiper et al. | |
| 2011/0233522 A1* | 9/2011 | Cohen | H01L 29/0673 257/24 |
| 2011/0254138 A1* | 10/2011 | Babich | H01L 21/02115 257/629 |
| 2011/0309440 A1* | 12/2011 | Hao | H01L 21/823412 257/337 |
| 2013/0178024 A1 | 7/2013 | Flachowsky et al. | |
| 2014/0011340 A1* | 1/2014 | Song | H01L 29/6653 438/478 |
| 2015/0325558 A1* | 11/2015 | Hikasa | H01L 29/16 257/49 |
| 2015/0364580 A1 | 12/2015 | Jangjian et al. | |
| 2015/0372144 A1* | 12/2015 | Fang | H01L 29/7851 257/192 |
| 2016/0043073 A1* | 2/2016 | Tamura | H01L 27/0664 257/140 |
| 2016/0240638 A1* | 8/2016 | Ikura | H01L 29/7397 |
| 2017/0309574 A1* | 10/2017 | Yamada | H01L 23/53295 |
| 2017/0338307 A1* | 11/2017 | Yilmaz | H01L 29/66348 |
| 2017/0352595 A1* | 12/2017 | Li | H01L 21/0257 |
| 2017/0358660 A1* | 12/2017 | Cheng | H01L 29/66666 |
| 2017/0373007 A1* | 12/2017 | Basker | H01L 23/535 |

\* cited by examiner

METHOD TO IMPROVE FINFET DEVICE PERFORMANCE

CROSS-REFERENCES TO RELATED APPLICATIONS

The present application claims priority to Chinese patent application No. 201610927351.6, filed with the State Intellectual Property Office of People's Republic of China on Oct. 31, 2016, the content of which is incorporated herein by reference in its entirety.

FIELD OF THE DISCLOSURE

The present disclosure relates to integrated semiconductor devices, and more particularly to a method for manufacturing a fin-type field effect transistor device with improved performance.

BACKGROUND OF THE INVENTION

As the feature size of semiconductor devices continues to decrease, fabrication processes become more difficult to improve the device performance. In order to further increase the carrier mobility of a P-channel metal oxide semiconductor (PMOS) device, the Ge content in an epitaxial SiGe source and drain may be increased.

The present inventor discovered that an increase of the Ge content in the SiGe makes p-type dopants (e.g., boron) to have more difficulty to penetrate into the SiGe. This is because Ge occupies a relatively large area in the Si lattice, reducing the probability that the dopant occupies the lattice positions. On the other hand, more Ge is also located relatively in the Si lattice spaces, which will affect the diffusion of the p-type dopants. Thus, PMOS devices require a higher thermal budget so that the p-type dopant can be more easily included into the SiGe.

However, a high thermal budget will make a diffusion of dopants (e.g., phosphorus) into the source and drain regions of an N-channel metal oxide semiconductor (NMOS) more severe, which can exacerbate the short channel effect, thereby reducing the performance of an NMOS device. Thus, NMOS devices require a lower thermal budget.

Thus, there is a need for a method of manufacturing a semiconductor device that can take into account the opposite thermal budget requirements of PMOS and NMOS devices.

BRIEF SUMMARY OF THE INVENTION

Embodiments of the present disclosure provide a method for manufacturing a semiconductor device that can satisfy the thermal budget requirements of forming PMOS and NMOS devices. The method enables a better penetration of p-type dopants into the source and drain regions of the PMOS device without affecting the performance of the NMOS device.

In one embodiment, a method for manufacturing a semiconductor device includes providing a substrate structure having a PMOS region and an NMOS region. The PMOS region includes a first semiconductor region, a first gate structure on the first semiconductor region, and a first source region and a first drain region on opposite sides of the first gate structure. The NMOS region includes a second semiconductor region and a second gate structure on the second semiconductor region. The method also includes introducing a p-type dopant into the first source region and the first drain region; performing a first annealing process; forming a second source region and a second drain region on opposite sides of the second gate structure; introducing an n-type dopant into the second source region and the second drain region; and performing a second annealing process.

In one embodiment, the first annealing process is performed at a temperature in the range between 900° C. and 1050° C., and the second annealing process is performed at a temperature in a range between 950° C. and 1350° C.

In one embodiment, the first annealing process includes a spike annealing; and the second annealing process comprises a laser annealing or a flash annealing. In one embodiment, the spike annealing is performed at a temperature in a range between 900° C. and 1050° C. the laser annealing or the flash annealing is performed at a temperature in a range between 950° C. and 1350° C.

In one embodiment, the PMOS region includes a first fin on the first semiconductor region, the first gate structure spanning across the first fin; and the NMOS region comprises a second fin on the second semiconductor region, the second gate structure spanning across the second fin.

In one embodiment, the first source region and the first drain region are formed by removing a portion of the first fin not covered by the first gate structure by performing an etch process to form a first recess; and epitaxially growing a first semiconductor material in the first recess to form the first source region and the first drain region.

In one embodiment, the first semiconductor material includes SiGe.

In one embodiment, introducing the n-type dopant into the second source region and the second drain region includes removing a portion of the second fin not covered by the second gate structure by performing an etch process to form a second recess; and epitaxially growing a second semiconductor material in the second recess to form the second source region and the second drain region. The n-type dopant is introduced into the second source region and the second drain region by performing an in situ doping process.

In one embodiment, the second semiconductor material includes Si or SiC.

In one embodiment, introducing the n-type dopant into the second source region and the second drain region includes removing a portion of the second fin not covered by the second gate structure by performing an etch process to form a second recess; and epitaxially growing a second semiconductor material in the second recess to form the second source region and the second drain region. The n-type dopant is introduced into the second source region and the second drain region by performing an ion implantation process.

In one embodiment, the method further includes, prior to performing the second annealing process, forming a silicon oxide layer on the PMOS region, the NMOS region, and the second source region and the second drain region.

Embodiments of the present disclosure further provide a method of forming a semiconductor structure. The method may include providing a substrate structure having a PMOS region and an NMOS region, the PMOS region including a first semiconductor region, a first gate structure on the first semiconductor region, and a first source region and a first drain region in the first semiconductor region on opposite sides of the first gate structure, the NMOS region including a second semiconductor region and a second gate structure on the second semiconductor region; epitaxially growing a SiGe material in the first source and drain regions; implanting a dose of p-type dopant into the SiGe material; performing a spike annealing process; forming a recess in the second semiconductor region on opposite sides of the second gate structure; epitaxially growing a SiP material in the recess; implanting a dose of n-type dopant into the SiP material; and performing a laser spike annealing process.

The following detailed description together with the accompanying drawings will provide a better understanding of the nature and advantages of the present disclosure.

DETAILED DESCRIPTION OF THE INVENTION

Figure 1:
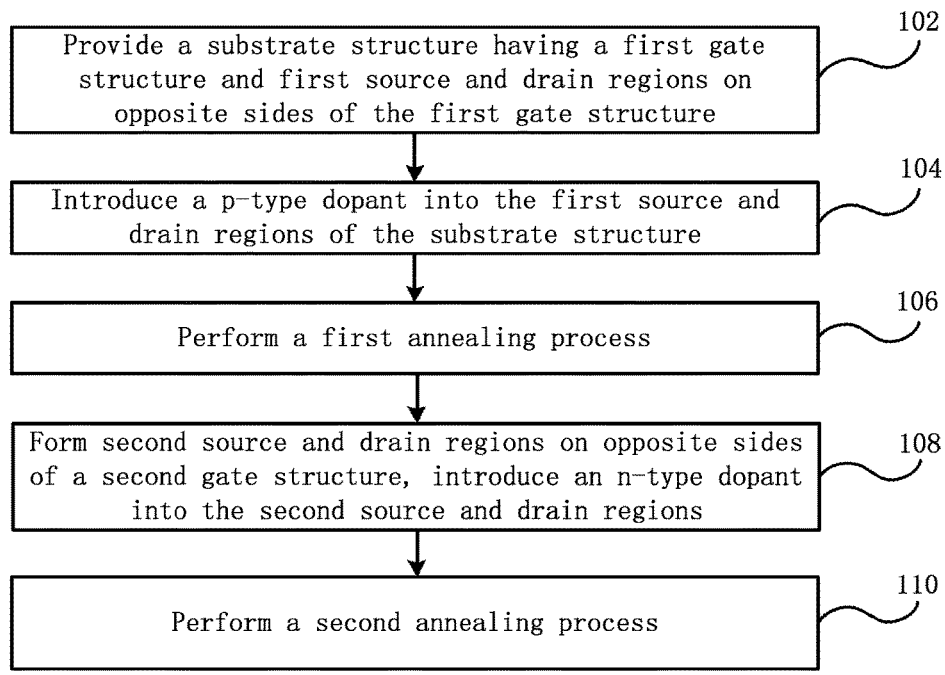
FIG. 1 is a flowchart of a method for manufacturing a semiconductor device according to an embodiment of the present disclosure.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

It is noted that the reference numerals and letters denote similar items in the accompanying drawings. Thus, once an item is defined or illustrated in a drawing, it will not be further described in subsequent drawings.

FIG. 1 is a simplified flowchart of a method for manufacturing a semiconductor device according to an embodiment of the present disclosure. Referring to FIG. 1, the method may include the following steps:

Step 102: providing a substrate structure including a PMOS region and an NMOS region. The PMOS region may include a first semiconductor region, a first gate structure on the first semiconductor region, and a first source region and a first drain region disposed on opposite sides of the first gate structure. Herein, the first source region and the first drain region may be a raised first source region and a raised first drain region formed by an epitaxially grown SiGe. The NMOS region may include a second semiconductor region and a second gate structure on the second semiconductor region. The substrate structure may also include a lightly doped drain (LDD) region under the first gate structure and the second gate structure.

Step 104: introducing a p-type dopant into the first source region and the first drain region of the substrate structure. For example, the first source region and the first drain region of the substrate structure may be p+ doped by performing an ion implantation process.

Step 106: performing a first annealing process.

Step 108: forming a second source region and a second drain region on opposite sides of the second gate structure, and introducing an n-type dopant into the second source region and the second drain region. The second source region and the second drain region may be a raised first source region and a raised first drain region formed by an epitaxially grown Si or SiC. For example, the second source region and the second drain region of the substrate structure may be n+ doped by performing an ion implantation process.

Step 110: performing a second annealing process.

As used herein, the term "n+ doped region" refers to a heavily doped region having an n-type dopant concentration of equal to or greater than $1 \times 10^{19}$ atoms/cm$^3$. The term "p+ doped region" refers to a heavily doped region having a p-type dopant concentration of equal to or greater than $1 \times 10^{19}$ atoms/cm$^3$.

The method according to one embodiment of the present disclosure can take into account the thermal budget requirements of the PMOS device and the NMOS device, the first annealing process is performed after the introduction of the p-type dopant into the first source region and the first drain region of the PMOS region, and the second annealing process is performed after the introduction of the n-type dopant into the second source region and the second drain region of the NMOS region. The prior art approach utilizes a single annealing process for the substrate structure after the p-type dopant is introduced into the source and drain regions of the PMOS region and the n-type dopant is introduced into the source and drain regions of the NMOS region. In contrast, in accordance with the present invention, the p-type dopant undergoes two annealing processes, and more thermal budgets can cause the p-type dopant to better diffuse into the first source and drain regions. On the other hand, the n-type dopant experiences only the second annealing process, thereby reducing the diffusion of the n-type dopant, alleviating the short-channel effect, and improving the performance of the NMOS device.

The method according to embodiments of the present disclosure is not only suitable for manufacturing planar transistor devices, but also for fin-type field effect (FinFET) transistor devices.

Figure 2:
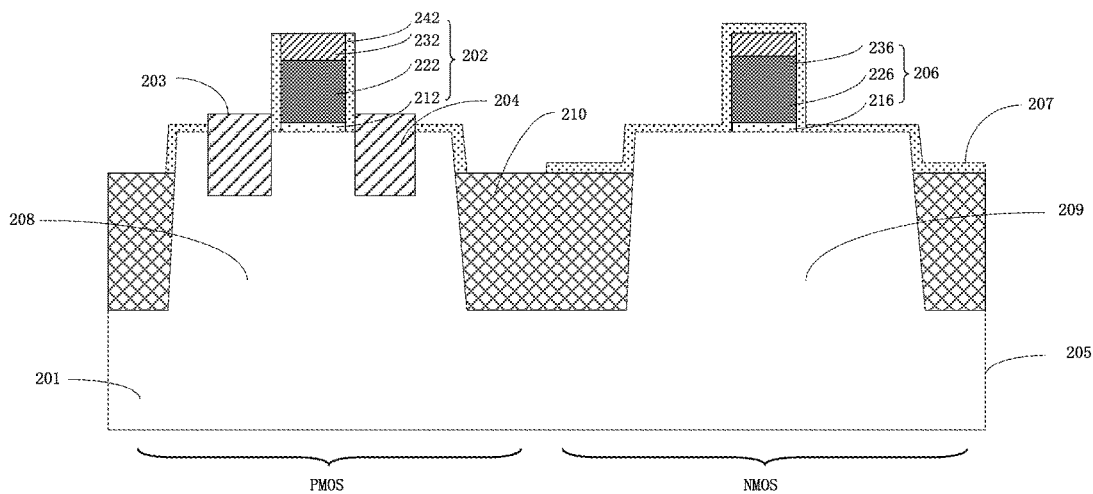
FIGS. 2 through 4 are cross-sectional views illustrating intermediate stages of a method for manufacturing a semiconductor device according to one embodiment of the present disclosure.
Figure 3:
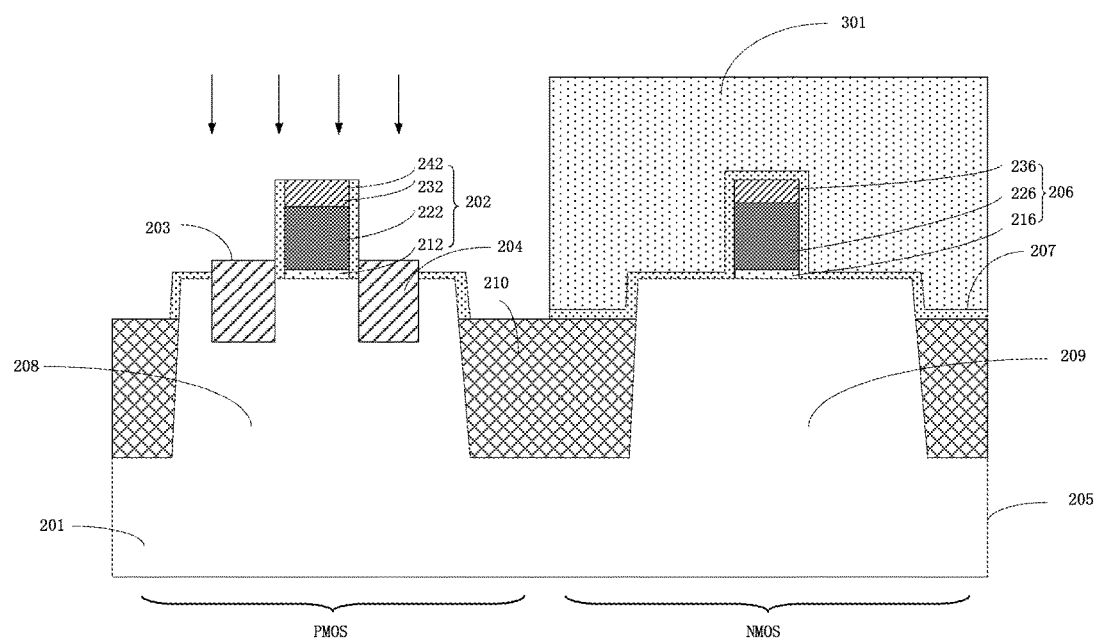
Figure 4:
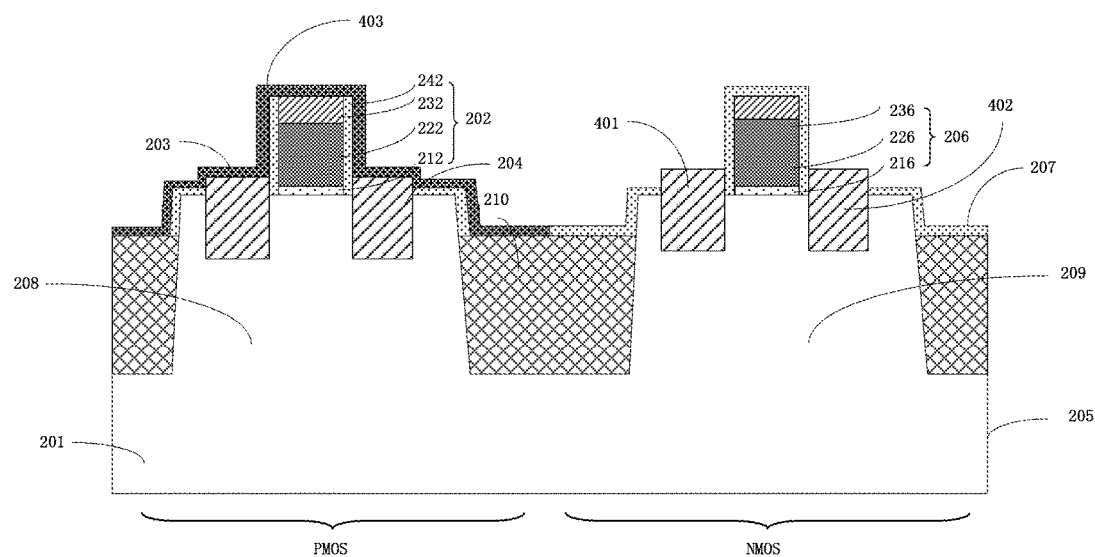

FIGS. 2 through 4 are cross-sectional views of various stages of a method for manufacturing a semiconductor device according to some embodiments of the present disclosure. The method will be described in detail with reference to FIGS. 2 through 4.

Referring to FIG. 2, a substrate structure is provided. The substrate structure includes a PMOS region and an NMOS region. The PMOS region includes a first semiconductor region (e.g., n-type silicon) 201, a first gate structure 202 on the first semiconductor region, and a first source region 203 and a first drain region 204 on opposite sides of first gate structure 202. The NMOS region includes a second semiconductor region (e.g., p-type silicon) 205, and a second gate structure 206 on the second semiconductor region. The PMOS region and the NMOS region may be separated by an isolation structure 210, e.g., a shallow trench isolation (STI).

First gate structure 202 may include a first gate dielectric layer 212 (e.g., silicon oxide), a first gate 222 (e.g., polysilicon) on first gate dielectric layer 212, a first hardmask layer 232 (e.g., silicon nitride) on first gate 222, and a first spacer 242 (e.g., silicon nitride or silicon oxide) on sidewalls of first gate dielectric layer 212, first gate 222, and first hardmask layer 232. Second gate structure 206 may include a second gate dielectric layer 216 (e.g., silicon oxide), a second gate 226 (e.g., polysilicon) on second gate dielectric layer 216, a second hardmask layer 236 (e.g., silicon nitride) on second gate 226. It is to be understood that first gate structure 202 and second gate structure 206 are not limited to the above-described exemplary structures. For example, first gate structure 202 and second gate structure 206 may not have some of the above-described layers, for example, first hardmask layer 232 or second hardmask layer 236 may be omitted, or additional layers may be included, e.g., a buffer layer (not shown) may be disposed between first gate 222 and first hardmask layer 232.

In one embodiment, referring still to FIG. 2, the PMOS region may further include a first fin 208 on first semiconductor region 201, first gate structure 202 may span across first fin 208. The NMOS region may further include a second fin 209 on second semiconductor region 205, second gate structure 206 may span across second fin 209. First fin 208 and second fin 209 each can be semiconductor fins. First fin 208 may have the same material or different material as that of the first semiconductor region. Similarly, second fin 209 may have the same material or different material as that of the second semiconductor region.

As used herein, the term "a gate structure spans across a fin" means that the gate structure is formed on an upper surface portion and a side surface portion of the fin, and the gate structure is also formed on a surface portion of a semiconductor region. For example, the term "first gate structure spans across the first fin" means that the first gate structure is formed on a portion of an upper surface and a portion of a side surface the first fin, and the gate structure is also formed on a portion of the surface of the first semiconductor region.

In one embodiment, the first source region and the first drain region may be formed using the following steps: forming a mask layer 207 on the NMOS region, and etching a portion of first fin 208 that is not covered by mask layer 207 to form a recess. A first semiconductor material is then epitaxially grown in the recess to form first source region 203 and first drain region 204. In one embodiment, the first semiconductor material may include SiGe. In some embodiments, first fin 208 may have a dummy gate (not shown) at its distal end, performing an etch process on first fin 208 may remove a portion of the first fin that is not covered by first gate structure 202 and between the dummy gate and first gate structure 202 (as shown in FIG. 2). The presence of the dummy gate can improve the epitaxial morphology of subsequent formed first source region 203 and first drain region 204, so that a compressive stress can be better introduced into the channel. It is to be noted that the surface at the distal end of first fin 208 includes mask layer 207, but it is merely exemplary and is not intended to limit the scope of the present disclosure. Foe example, in some other embodiments, the upper portion on opposite sides of first gate structure 202 may be completely removed to form a recess, and the first semiconductor material may be epitaxially grown in the recess to form first source region 203 and first drain region 204.

Next, referring to FIG. 3, a p-type dopant is introduced into first source region 203 and first drain region 204. For example, a barrier layer 301 (e.g., a photoresist) may be formed on the NMOS region, and an ion implantation of a p+ dopant may be formed into first source region 203 and first drain region 204. The p-type dopant (e.g., boron) can be introduced into first source region 203 and first drain region 204. Thereafter, barrier layer 301 is removed.

Next, a first annealing process is performed. The first annealing process ensures the diffusion of the p-type dopant into first source region 203 and first drain region 204. In one embodiment, the first annealing process may include a spike annealing. In one embodiment, the first annealing process may be performed at a temperature in the range between 900° C. and 1050° C., e.g., 950° C., 1020° C., or 1040° C.

Next, referring to FIG. 4, a second source region 401 and a second drain region 402 are formed on opposite sides of second gate structure 206, an n-type dopant is introduced into second source region 401 and second drain region 402.

In one embodiment, a mask layer 403 may be formed on the PMOS region, and a portion of second fin 209 not covered by second gate structure 206 is removed by etching to form a recess. Then, a second semiconductor material (e.g., Si or SiC) is epitaxially grown in the recess to form second source region 401 and second drain region 402, and an ion implantation of an n-dopant (e.g., phosphorous) can be performed in situ during the epitaxial growth of the semiconductor material.

In another embodiment, a mask layer 403 may be formed on the PMOS region, and a portion of second fin 209 not covered by second gate structure 206 is removed by etching to form a recess. Then, a second semiconductor material (e.g., Si or SiC) is epitaxially grown in the recess to form second source region 401 and second drain region 402. An ion implantation of an n+ dopant can be performed into second source region 401 and second drain region 402.

Next, a second annealing process is performed. The second annealing process activates the p-type dopant and the n-type dopant. In one embodiment, the second annealing process may include laser annealing or flash annealing. In one embodiment, the second annealing process is performed at a temperature in the range between 950° C. and 1350° C., e.g., 1000° C., 1100° C., or 1200° C. and for a time duration in the range between 400 μs and 800 μs. In some other embodiments, a silicon oxide layer may be deposited on the surface of the substrate structure shown in FIG. 4, i.e., on the surface of the PMOS region, the NMOS region, and second source region 401 and second drain region 402. The silicon oxide layer can prevent the dopant in second source region 401 and second drain region 402 from diffusing out of the surface of the substrate structure.

Next, mid-end-of-line (MEOL) and back-end-of-line (BEOL) fabrication processes may be performed. Because the MEOL and BEOL fabrication processes are not the focus of the present disclosure, their description will bot be provided herein for the sake of brevity.

Figure 5:
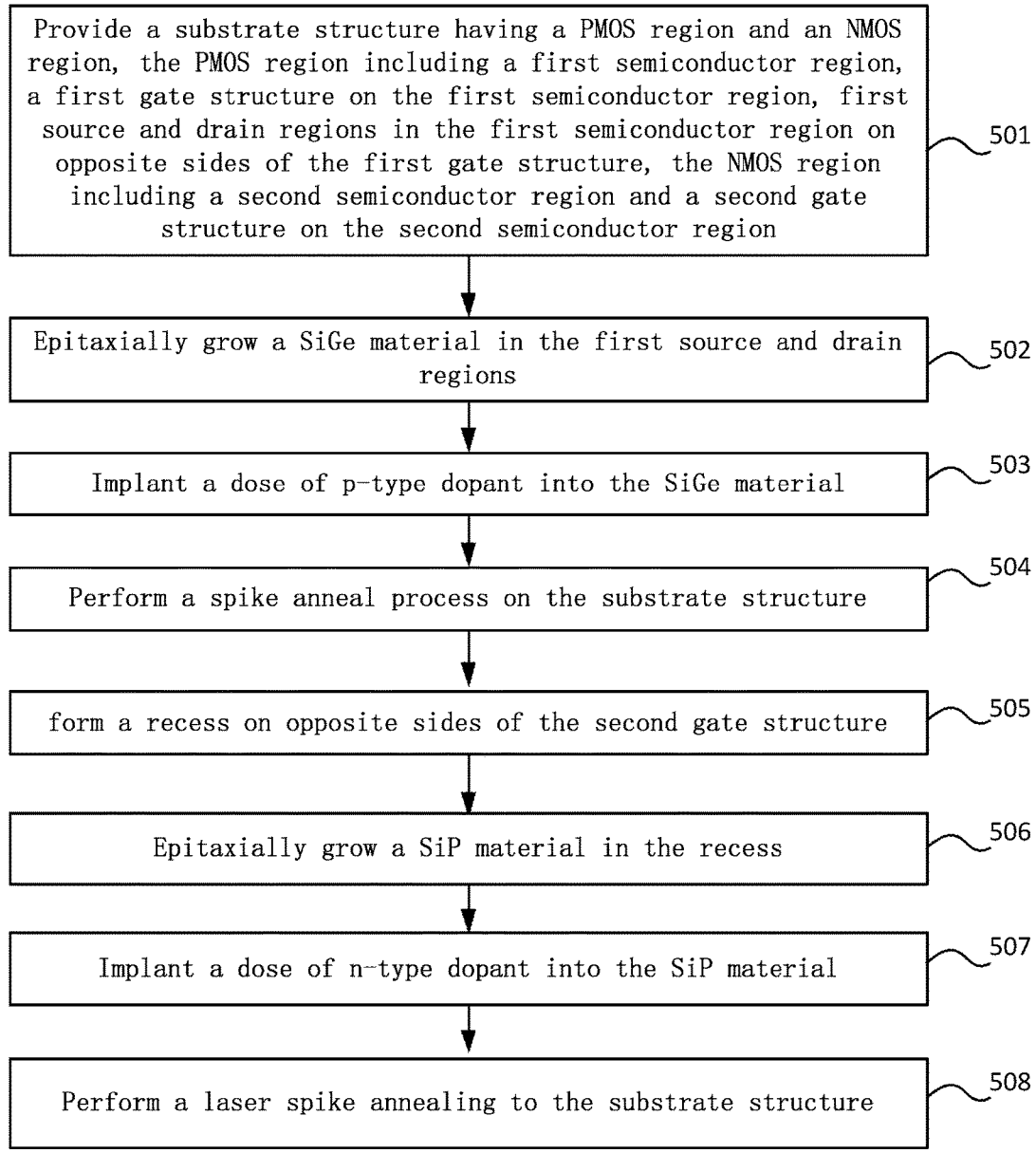
FIG. 5 is a flowchart illustrating a method of forming a semiconductor structure according to another embodiment of the present disclosure.

FIG. 5 is a flowchart illustrating a method of forming a semiconductor structure according to another embodiment of the present disclosure. Referring to FIG. 5, the method may include the following steps:

Step 501: providing a substrate structure including a PMOS region and an NMOS region. The PMOS region may include a first semiconductor region, a first gate structure on the first semiconductor region, and a first source region and a first drain region disposed on opposite sides of the first gate structure. The NMOS region may include a second semiconductor region and a second gate structure on the second semiconductor region. The substrate structure may also include a lightly doped drain (LDD) region under the first gate structure and the second gate structure.

Step 502: epitaxially growing a SiGe material layer in the first source and drain region. The SiGe material layer may form raised first and drain regions.

Step 503: implanting a dose of a p-type into the SiGe material layer.

Step 504: performing a spike annealing process on the substrate structure.

Step 505: forming a recess in the semiconductor region on opposite sides of the second gate structure.

Step 506: epitaxially growing a SiP material layer in the recess. The SiP material layer may be a raised second source region and a raised second drain region.

Step 507: implanting a dose of an n-type dopant into the second source region and the second drain region, i.e., into the SiP material layer. For example, the second source region and the second drain region of the substrate structure may be n+ doped.

Step 508: performing a laser spike annealing process to the substrate structure.

Figure 6:
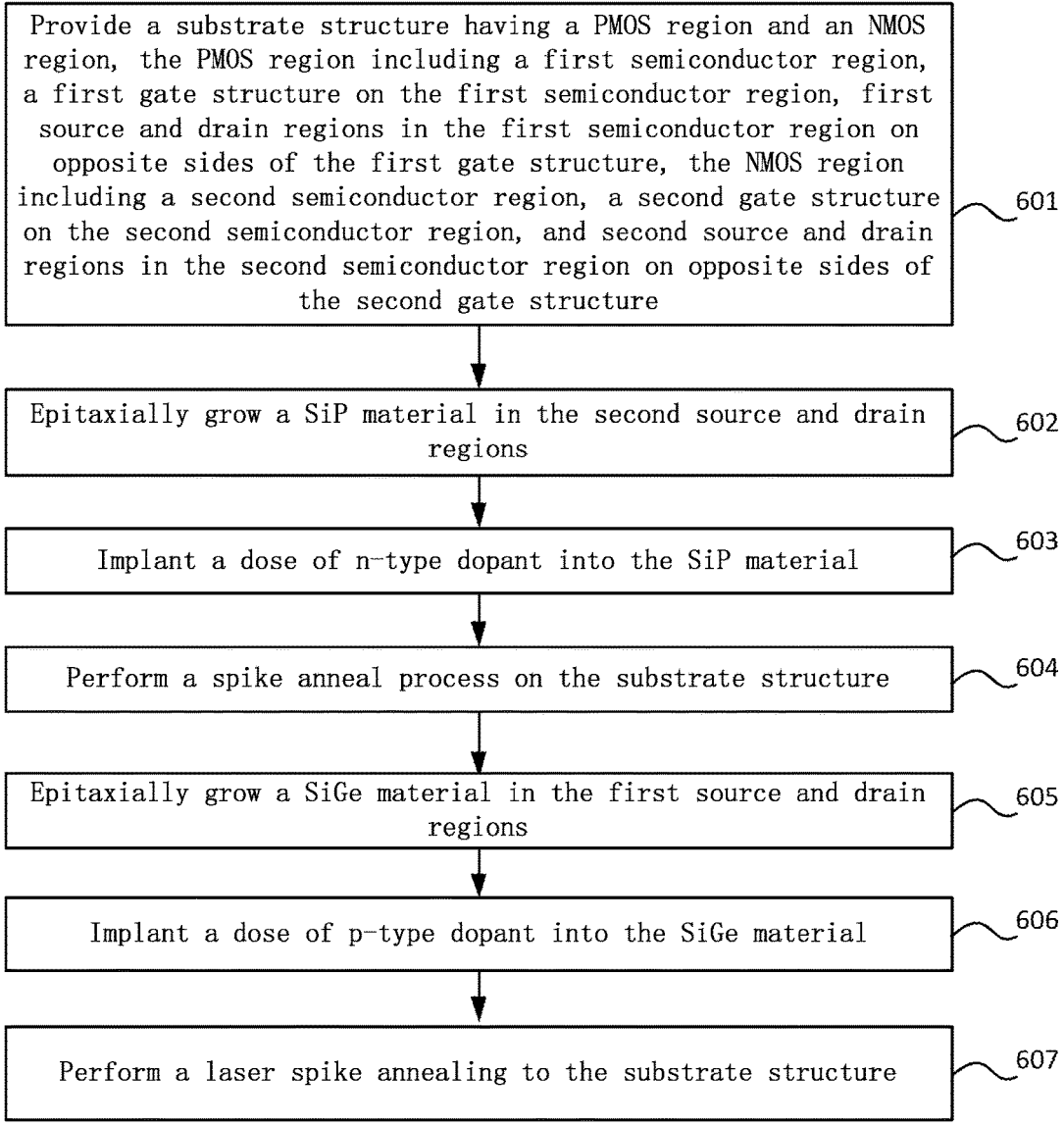
FIG. 6 is a flowchart illustrating a method of forming a semiconductor structure according to yet another embodiment of the present disclosure.

FIG. 6 is a flowchart illustrating a method of forming a semiconductor structure according to yet another embodiment of the present disclosure. Referring to FIG. 6, the method may include the following steps:

Step 601: providing a substrate structure including a PMOS region and an NMOS region. The PMOS region may include a first semiconductor region, a first gate structure on the first semiconductor region, and a first source region and a first drain region disposed in the first semiconductor region on opposite sides of the first gate structure. The NMOS region may include a second semiconductor region, a second gate structure on the second semiconductor region, and a second source region and a second drain region disposed in the second semiconductor region on opposite sides of the second gate structure. The substrate structure may also include a lightly doped drain (LDD) region under the first gate structure and the second gate structure.

Step 602: epitaxially growing a SiP material layer in the second source and drain regions. The SiP material layer may form a raised second source region and a raised second drain region.

Step 603: implanting a dose of an n-type into the SiP material layer. In one embodiment, the SiP material layer may have a dose of n-type dopant equal to or greater than $1\times10^{14}$ atoms per square centimeter.

Step 604: performing a spike annealing process on the substrate structure.

Step 605: epitaxially growing a SiGe material layer in the first source and drain regions. The SiGe material layer may be a raised first source region and a raised first drain region.

Step 606: implanting a dose of a p-type dopant into the first source region and the first drain region, i.e., into the SiGe material layer. For example, the first source region and the first drain region of the substrate structure may be p+ doped.

Step 607: performing a laser spike annealing process to the substrate structure.

Figure 7:
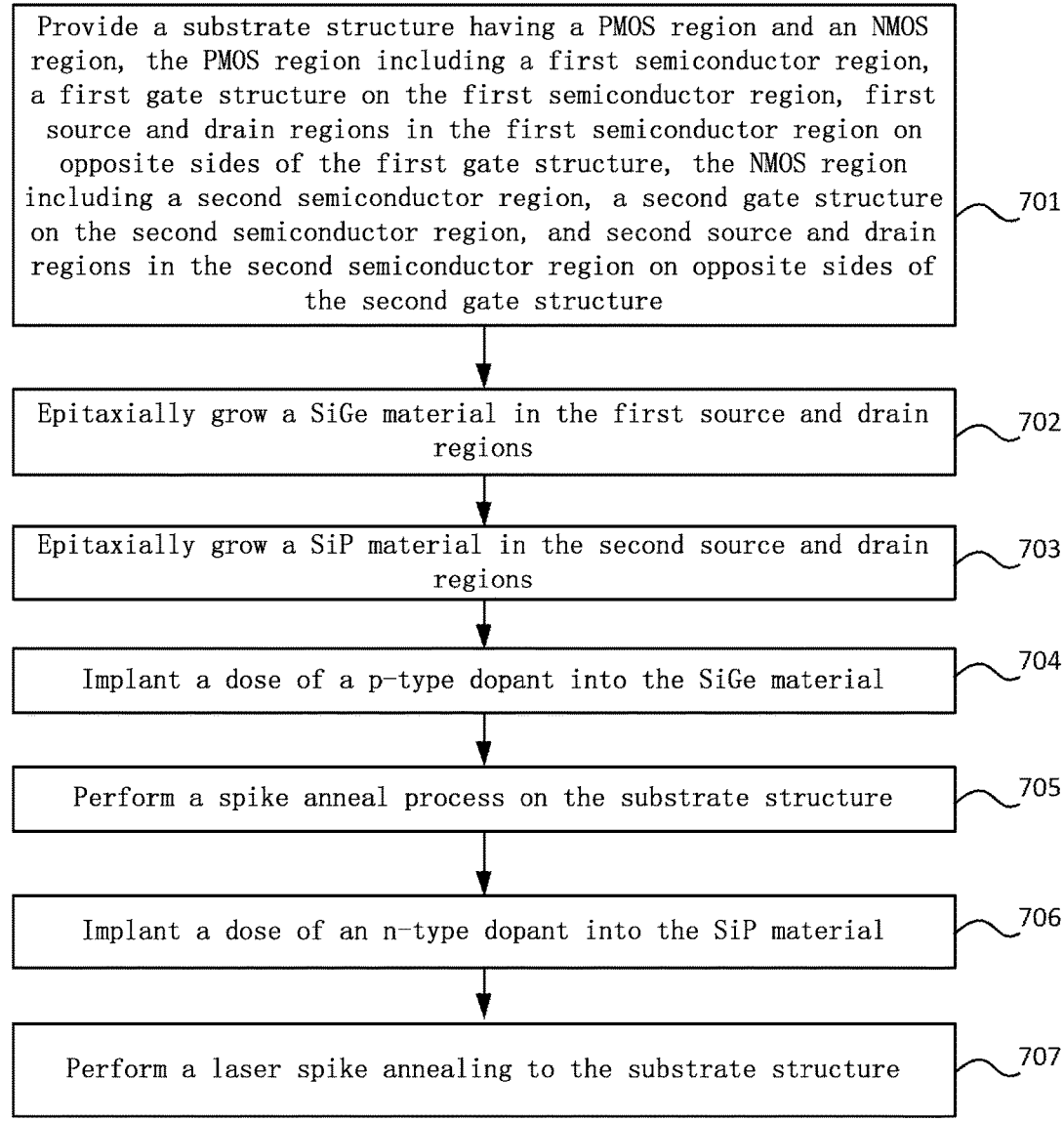
FIG. 7 is a flowchart illustrating a method of forming a semiconductor structure according to still another embodiment of the present disclosure.

FIG. 7 is a flowchart illustrating a method of forming a semiconductor structure according to further embodiments of the present disclosure. Referring to FIG. 7, the method may include the following steps:

Step 701: providing a substrate structure including a PMOS region and an NMOS region. The PMOS region may include a first semiconductor region, a first gate structure on the first semiconductor region, and a first source region and a first drain region disposed in the first semiconductor region on opposite sides of the first gate structure. The NMOS region may include a second semiconductor region, a second gate structure on the second semiconductor region, and a second source region and a second drain region disposed in the second semiconductor region on opposite sides of the second gate structure. The substrate structure may also include a lightly doped drain (LDD) region under the first gate structure and the second gate structure.

Step 702: epitaxially growing a SiGe material layer in the first source and drain regions. The SiGe material layer may form a raised first source region and a raised first drain region.

Step 703: epitaxially growing a SiP material layer in the second source and drain region. The SiP material layer may form a raised second source region and a raised second drain region.

Step 704: implanting a dose of a p-type into the SiGe material layer while masking the NMOS region. In one embodiment, the SiGe material layer may be p+ doped.

Step 705: performing a spike annealing process on the substrate structure.

Step 706: implanting a dose of an n-type dopant into the second source region and the second drain region, i.e., into the SiP material layer while masking the PMOS region. For example, the second source region and the second drain region of the substrate structure may be an n+ doped region.

Step 707: performing a laser spike annealing process to the substrate structure.

Figure 8:
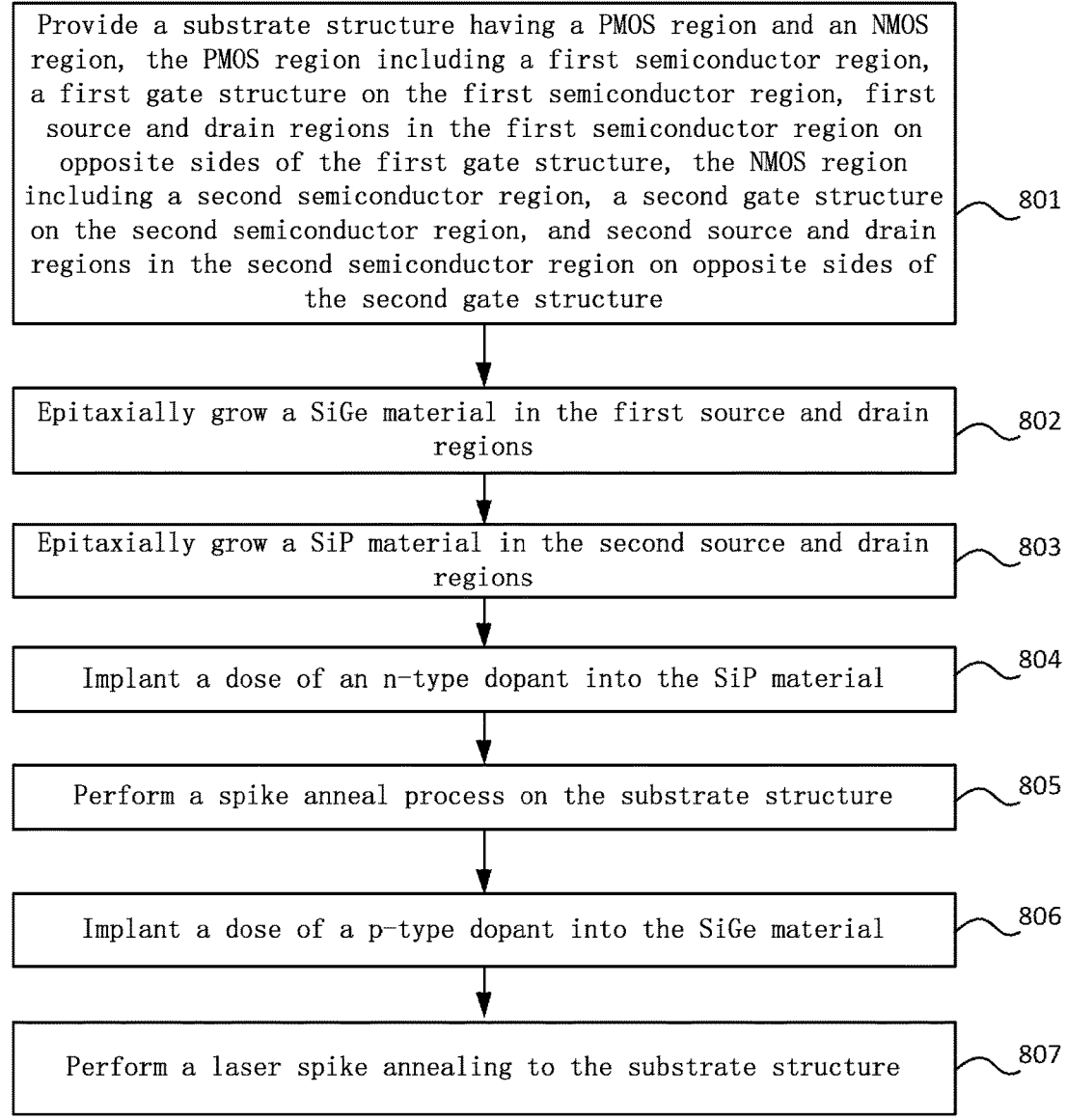
FIG. 8 is a flowchart illustrating a method of forming a semiconductor structure according to further embodiments of the present disclosure.

FIG. 8 is a flowchart illustrating a method of forming a semiconductor structure according to further embodiments of the present disclosure. Referring to FIG. 8, the method may include the following steps:

Step 801: providing a substrate structure including a PMOS region and an NMOS region. The PMOS region may include a first semiconductor region, a first gate structure on the first semiconductor region, and a first source region and a first drain region disposed in the first semiconductor region on opposite sides of the first gate structure. The NMOS region may include a second semiconductor region, a second gate structure on the second semiconductor region, and a second source region and a second drain region disposed in the second semiconductor region on opposite sides of the second gate structure. The substrate structure may also include a lightly doped drain (LDD) region under the first gate structure and the second gate structure.

Step 802: epitaxially growing a SiGe material layer in the first source and drain regions. The SiGe material layer may form a raised first source region and a raised first drain region.

Step 803: epitaxially growing a SiP material layer in the second source and drain region. The SiP material layer may form a raised second source region and a raised second drain region.

Step 804: implanting a dose of an n-type into the SiP material layer while masking the PMOS region. The second source and drain regions have a dose of n-type dopant equal to or greater than $1\times10^{14}$ atoms per square centimeter.

Step 805: performing a spike annealing process on the substrate structure.

Step 806: implanting a dose of a p-type dopant into the first source region and the first drain region, i.e., into the SiGe material layer while masking the NMOS region. For example, the first source region and the first drain region of the substrate structure may be p+ doped, i.e., the first source and drain regions will each have a dose of p-type dopant equal to or greater than $1\times10^{14}$ atoms per square centimeter.

Step 807: performing a laser spike annealing process to the substrate structure.

Thus, embodiments of the present disclosure provide a detailed description of various methods of manufacturing a semiconductor device. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a semiconductor device, the method comprising:
   providing a substrate structure comprising a PMOS region and an NMOS region, the PMOS region including a first semiconductor region, a first gate structure on the first semiconductor region, and a first epitaxial grown raised source region and a first epitaxial grown raised drain region on opposite sides of the first gate structure, the NMOS region including a second semiconductor region and a second gate structure on the second semiconductor region;
   introducing a p-type dopant into the first epitaxial grown raised source region and the first epitaxial grown raised drain region;
   performing a first annealing process on the substrate structure after the p-type dopant has been introduced into the first epitaxial grown raised source region and the first epitaxial grown raised drain region;
   forming a second source region and a second drain region on opposite sides of the second gate structure;
   introducing an n-type dopant into the second source region and the second drain region; and
   performing a second annealing process on the substrate structure after the n-type dopant has been introduced into the second source region and the second drain region.

2. The method of claim 1, wherein the first annealing process is performed at a temperature in a range between 900° C. and 1050° C., and the second annealing process is performed at a temperature in a range between 950° C. and 1350° C. and for a time duration in a range between 400 μs and 800 μs.

3. The method of claim 1, wherein:
   the first annealing process comprises a spike annealing; and
   the second annealing process comprises a laser annealing or a flash annealing.

4. The method of claim 3, wherein the spike annealing is performed at a temperature in a range between 900° C. and 1050° C.

5. The method of claim 3, wherein the laser annealing or the flash annealing is performed at a temperature in a range between 950° C. and 1350° C. and for a time duration in a range between 400 μs and 800 μs.

6. The method of claim 1, wherein:
   the PMOS region comprises a first fin on the first semiconductor region, the first gate structure spanning across the first fin; and
   the NMOS region comprises a second fin on the second semiconductor region, the second gate structure spanning across the second fin.

7. The method of claim 6, wherein the first epitaxial grown raised source region and the first epitaxial grown raised drain region are formed by:
   removing a portion of the first fin not covered by the first gate structure by performing an etch process to form a first recess;

epitaxially growing a first semiconductor material in the first recess to form the first epitaxial grown raised source region and the first epitaxial grown raised drain region.

8. The method of claim 7, wherein the first semiconductor material comprises SiGe.

9. The method of claim 6, wherein introducing the n-type dopant into the second source region and the second drain region comprises:
   removing a portion of the second fin not covered by the second gate structure by performing an etch process to form a second recess; and
   epitaxially growing a second semiconductor material in the second recess to form the second source region and the second drain region,
   wherein the n-type dopant is introduced into the second source region and the second drain region by performing an in situ doping process.

10. The method of claim 9, wherein the second semiconductor material comprises Si or SiC.

11. The method of claim 6, wherein introducing the n-type dopant into the second source region and the second drain region comprises:
   removing a portion of the second fin not covered by the second gate structure by performing an etch process to form a second recess; and
   epitaxially growing a second semiconductor material in the second recess to form the second source region and the second drain region,
   wherein the n-type dopant is introduced into the second source region and the second drain region by performing an ion implantation process.

12. The method of claim 11, wherein the second semiconductor material comprises Si or SiC.

13. The method of claim 1, further comprising, prior to performing the second annealing process: forming a silicon oxide layer on the PMOS region, the NMOS region, and the second source region and the second drain region.

* * * * *